US009772369B2

(12) United States Patent
Das et al.

(10) Patent No.: US 9,772,369 B2
(45) Date of Patent: Sep. 26, 2017

(54) PRECISION MEASUREMENT OF VOLTAGE DROP ACROSS A SEMICONDUCTOR SWITCHING ELEMENT

(71) Applicants: Anandarup Das, Trondheim (NO); Ivar Haakon Lysfjord, Inderoey (NO)

(72) Inventors: Anandarup Das, Trondheim (NO); Ivar Haakon Lysfjord, Inderoey (NO)

(73) Assignee: Siemens Aktiengesellschaft, München (DE)

( * ) Notice: Subject to any disclaimer, the term of this patent is extended or adjusted under 35 U.S.C. 154(b) by 216 days.

(21) Appl. No.: 14/682,730

(22) Filed: Apr. 9, 2015

(65) Prior Publication Data
US 2015/0301103 A1 Oct. 22, 2015

(30) Foreign Application Priority Data

Apr. 17, 2014 (EP) .................................... 14165224

(51) Int. Cl.
*G01R 31/26* (2014.01)
*G01R 31/42* (2006.01)
*G01R 19/00* (2006.01)

(52) U.S. Cl.
CPC ..... *G01R 31/2608* (2013.01); *G01R 31/2617* (2013.01); *G01R 31/2642* (2013.01);
(Continued)

(58) Field of Classification Search
CPC ............ G01R 31/2608; G01R 31/2617; G01R 31/2642; G01R 31/2621; G01R 31/275;
(Continued)

(56) References Cited

U.S. PATENT DOCUMENTS

| 2,909,730 A | * | 10/1959 | Timm | ................ | G01R 31/2608 |
| | | | | | 324/762.08 |
| 2,922,954 A | * | 1/1960 | Bigelow | ............ | G01R 31/2608 |
| | | | | | 324/762.08 |

(Continued)

FOREIGN PATENT DOCUMENTS

| EH | WO2012175603 A1 | 12/2012 |
| EP | 2015086 A1 | 1/2009 |
| WO | WO2005052610 A1 | 6/2005 |

OTHER PUBLICATIONS

Huiting Chen et al., Current Mirror Circuit with accurate Mirror Gain for low β Transistors, ISCAS 2001 IEEE Intern. Symposium on Circuits and Systems (Cat.No. 01CH37196), vol. 1, pp. 536-539, ISBN 0-7803-6685-9; 2001.

(Continued)

*Primary Examiner* — Jermele M Hollington
*Assistant Examiner* — Christopher McAndrew
(74) *Attorney, Agent, or Firm* — Lempia Summerfield Katz LLC

(57) ABSTRACT

An apparatus provides precision measurement of voltage drop across a semiconductor switching element of a subsea device. The apparatus includes (a) a first circuit path having a first protective element, a first impedance element and a voltage source, wherein the first circuit path is configured to be connected between the first terminal and the second terminal of the semiconductor switching element, (b) a second circuit path formed between a first output terminal and a second output terminal, the second circuit path having a second protective element and a second impedance element, wherein the second protective element is identical to the first protective element, and wherein the second impedance element is identical to the first impedance element, and (c) a regulating circuit configured to regulating the current in the second circuit path such that said current in the second (Continued)

circuit path is equal to the current in the first circuit path, wherein the voltage drop between the first terminal and the second terminal of the semiconductor switching element equals the difference between the voltage provided by the voltage source and the voltage drop between the first output terminal and the second output terminal.

17 Claims, 3 Drawing Sheets

(52) U.S. Cl.
CPC .......... *G01R 19/0084* (2013.01); *G01R 31/42* (2013.01); *H03K 2217/0027* (2013.01)

(58) Field of Classification Search
CPC ............ G01R 31/2884; G01R 31/2601; G01R 19/0092; G01R 19/00; G01R 27/14; G01R 27/08
USPC .............................................. 324/762.08, 713
See application file for complete search history.

(56) References Cited

U.S. PATENT DOCUMENTS

| | | | | | |
|---|---|---|---|---|---|
| 2,932,792 | A * | 4/1960 | Carroll | ............... | G01R 31/2608 324/762.08 |
| 3,054,954 | A * | 9/1962 | Boscia | ............... | G01R 31/2608 324/762.08 |
| 3,243,607 | A * | 3/1966 | Matsumoto | ............ | H03K 17/60 327/124 |
| 3,348,145 | A * | 10/1967 | Erath | ................. | G01R 31/2608 324/615 |
| 3,414,802 | A * | 12/1968 | Harrigan | ................... | G05F 1/59 307/44 |
| 3,445,769 | A * | 5/1969 | Erath | ................. | G01R 31/2608 324/756.04 |
| 3,676,767 | A * | 7/1972 | Boelter | ............. | G01R 31/2608 324/762.07 |
| 4,038,607 | A * | 7/1977 | Schade, Jr. | ............. | H03F 1/308 330/264 |
| 4,066,918 | A * | 1/1978 | Heuner | ............... | H01L 27/0255 257/356 |
| 4,179,650 | A * | 12/1979 | Fukushima | .......... | H03G 1/0035 323/315 |
| 4,952,866 | A * | 8/1990 | Van Tuijl | ................ | G05F 1/561 323/312 |
| 5,006,809 | A * | 4/1991 | Mang | ..................... | G01R 27/08 324/603 |
| 5,375,029 | A * | 12/1994 | Fukunaga | ............. | G05F 1/573 323/285 |
| 5,528,127 | A * | 6/1996 | Streit | ....................... | G05F 1/565 323/269 |
| 5,559,656 | A * | 9/1996 | Chokhawala | ....... | H01L 27/0248 361/111 |
| 6,756,787 | B2 * | 6/2004 | Ohlhoff | ............ | G01R 31/31924 324/537 |
| 7,071,664 | B1 * | 7/2006 | Teggatz | ................ | H02J 7/0063 323/273 |
| 7,821,245 | B2 * | 10/2010 | Tonge | .................... | G01R 19/10 323/314 |
| 9,039,279 | B2 * | 5/2015 | Sundaramoorthy | | G01R 31/2619 374/170 |
| 9,366,717 | B2 * | 6/2016 | Ratz | ..................... | G01R 31/2608 |
| 2003/0001666 | A1 * | 1/2003 | Watanabe | ........... | H03F 3/45237 327/563 |
| 2005/0218992 | A1 * | 10/2005 | Birkbeck | ................. | H03C 1/36 330/296 |
| 2006/0203400 | A1 * | 9/2006 | Bodano | ..................... | G05F 3/30 361/18 |
| 2008/0001666 | A1 * | 1/2008 | Szepesi | ................... | H03F 3/343 330/255 |
| 2008/0116817 | A1 * | 5/2008 | Chao | .................. | H05B 33/0851 315/189 |
| 2008/0195169 | A1 * | 8/2008 | Pinter | .................. | A61B 5/0424 607/28 |
| 2008/0272750 | A1 * | 11/2008 | Aitto-Oja | ............ | H02M 3/1584 323/266 |
| 2009/0034303 | A1 * | 2/2009 | Chakrabarti | ........ | B60L 11/1868 363/71 |
| 2009/0296441 | A1 * | 12/2009 | Klemt | ................... | H02M 1/088 363/131 |
| 2010/0002744 | A1 | 1/2010 | Sheahan | | |
| 2010/0084918 | A1 * | 4/2010 | Fells | ....................... | H02J 5/005 307/32 |
| 2010/0141229 | A1 * | 6/2010 | Satou | ................ | H01L 23/49575 323/282 |
| 2010/0202324 | A1 * | 8/2010 | Gorbachov | ............. | H04B 1/18 370/277 |
| 2011/0163814 | A1 * | 7/2011 | Hellberg | ............... | H03F 1/0205 330/302 |
| 2011/0221424 | A1 * | 9/2011 | McNamara | ........... | G01R 1/203 324/126 |
| 2012/0112775 | A1 * | 5/2012 | Domes | .................. | H03K 17/18 324/686 |
| 2012/0139130 | A1 * | 6/2012 | Satou | ................ | H01L 23/49575 257/784 |
| 2012/0187968 | A1 * | 7/2012 | Hashimoto | ........ | G01R 31/2839 324/750.01 |
| 2013/0027053 | A1 * | 1/2013 | Lee | .................. | G01R 31/31721 324/538 |
| 2013/0120030 | A1 | 5/2013 | Kora | | |
| 2013/0169297 | A1 * | 7/2013 | Pilz | ..................... | G01R 19/0092 324/713 |
| 2013/0177041 | A1 * | 7/2013 | Sundaramoorthy | | G01R 31/2619 374/178 |
| 2013/0265060 | A1 * | 10/2013 | Orendi | ................... | G01R 31/40 324/537 |
| 2013/0289665 | A1 * | 10/2013 | Marnfeldt | ......... | A61N 1/36125 607/62 |
| 2014/0003002 | A1 * | 1/2014 | Satou | ................ | H01L 23/49575 361/728 |
| 2014/0103898 | A1 * | 4/2014 | Shrivastava | ........ | H02M 3/1582 323/311 |

OTHER PUBLICATIONS

European Search Report for European Application No. 14165224.8-1560, mailed Oct. 10, 2014.

* cited by examiner

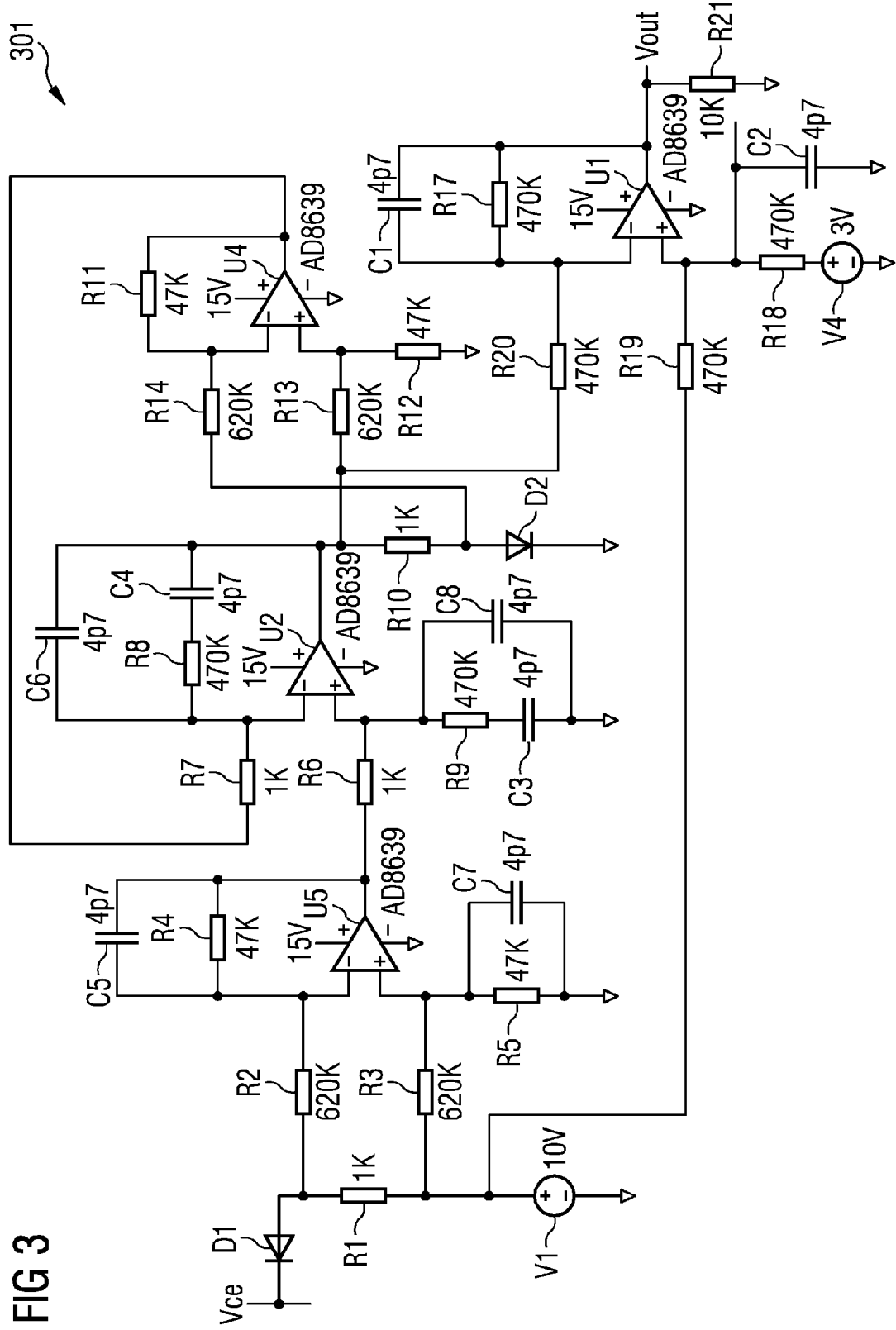

PRECISION MEASUREMENT OF VOLTAGE DROP ACROSS A SEMICONDUCTOR SWITCHING ELEMENT

RELATED CASE

This application claims the benefit of EP 14165224.8, filed on Apr. 17, 2014, which is hereby incorporated by reference in its entirety.

FIELD

The present embodiments relate to the field of measurement of voltage drop across a semiconductor switching element, in particular to an apparatus for precision measurement of such voltage drop. The present embodiments further relate to a subsea device including the aforementioned apparatus, a system for monitoring a subsea device, and a method of precision measurement of voltage drop across a semiconductor switching element.

BACKGROUND

Many electrically powered systems, such as adjustable speed drives (ASDs) for subsea applications in connection with, for example, oil and gas production, utilize semiconductor switching elements, such as insulated-gate bipolar transistors (IGBTs). For instance, IGBTs may be used in DC-AC converters. In subsea applications where IGBTs and other components are not accessible once a device has been arranged at the seabed, it is desirable to have access to information regarding changes in the state of the IGBTs, such as changes due to aging effects, so that an expected lifetime may be predicted and appropriate measures may be taken.

The on state voltage of the IGBT is the voltage (Vce) across the IGBT, from collector to emitter, when the IGBT is conducting current, and the IGBT is in so called saturation mode, meaning that the IGBT is operating as a switch. This is the normal operation for an IGBT. This voltage depends on several factors. The main factor that is dynamic (i.e., not decided by the physical construction of the device) is the current flowing through the IGBT. Increasing current means increasing voltage. Typical values for a saturated IGBT may be from 0.5V to 2.5V. Another factor that determinates the voltage is the aging of the IGBT. As the IGBT ages, the on state voltage Vce increases. The difference in the voltage due to aging is typically a few hundreds millivolts throughout the lifetime.

It is customary to provide some kind of voltage measurement/estimation circuit in order to be able to determine whether an IGBT is out of saturation or not. The Vce in the off state of the IGBT (i.e., the IGBT is not conducting any current) may be very high, and the measurement circuit needs to be protected from this voltage. This is often done by inserting a diode that protects the measurement circuit. Then, sending a current through the diode and the IGBT, the voltage between collector and emitter (Vce) in on state may be estimated by measuring the total voltage drop over the diode and Vce. The voltage of the diode may be estimated, and then withdrawn, and Vce remains.

A practical circuit 100 for this purpose is shown in FIG. 1. As shown, the current source is exchanged with a voltage source Vs and a series resistor R1. This has two reasons, the first being that when the IGBT is off, the current from a current source would have nowhere to go, except into the measurement circuit. The measurement circuit is by nature a high-impedance circuit, and therefore the current source will set up a high voltage, which may damage the measurement circuit. The other reason is that voltage sources are more available. When a voltage source Vs is used, the measurement of the voltage Vm will then be over the resistor R1 instead, thus the voltage Vce may be calculated by the formula $$Vs - Vm - V(D1) - Vce = 0.$$

By using such a circuit 100, the voltage drop over the diode D1 is not measured, and is therefore uncertain. The voltage drop over the diode D1 is non-linear both with regard to the current flowing through the diode D1 and the ambient temperature. Therefore, a Vce measurement based on the circuit 100 may not provide sufficient precision for determining the aging of the IGBT.

There may thus be a need for an improved way of measuring a voltage drop across a semiconductor switching element that provides sufficient precision to determine aging of the semiconductor switching element.

SUMMARY AND DESCRIPTION

The scope of the present invention is defined solely by the appended claims and is not affected to any degree by the statements within this summary.

According to a first aspect, there is provided an apparatus for precision measurement of a voltage drop between a first terminal and a second terminal of a semiconductor switching element. The apparatus includes (a) a first circuit path including a first protective element, a first impedance element and a voltage source, wherein the first circuit path is adapted to be connected between the first terminal and the second terminal of the semiconductor switching element, (b) a second circuit path formed between a first output terminal and a second output terminal, the second circuit path including a second protective element and a second impedance element, wherein the second protective element is identical to the first protective element, and wherein the second impedance element is identical to the first impedance element, and (c) a regulating circuit for regulating the current in the second circuit path such that said current in the second circuit path is equal to the current in the first circuit path, wherein the voltage drop between the first terminal and the second terminal of the semiconductor switching element equals the difference between the voltage provided by the voltage source and the voltage drop between the first output terminal and the second output terminal.

This aspect is based on the idea that a first circuit path is provided between the first and second terminals of the semiconductor switching element while a second circuit path having a second protective element and a second impedance element that are identical to corresponding first elements in the first circuit path is provided between a first and a second output terminal. A regulating circuit is provided that regulates the current in the second circuit path such that the current is equal to the current in the first circuit path. Thereby, the voltage between the first and second output terminals equals the sum of the voltage drops across the first protective element and the first impedance element in the first circuit path. In other words, the voltage across the first protective element is included in the measurement and does therefore not have to be estimated.

The first protective element, the first impedance element and the voltage source may be connected in series. In particular, one terminal of the first protective element may be connectable to the first terminal of the semiconductor switching element, while another terminal of the protective element may be connected to one terminal of the first impedance element. The other terminal of the first impedance element may be connected to one terminal of the voltage source, and the other terminal of the voltage source may be connectable to the second terminal of the semiconductor switching element.

The first protective element is arranged to allow a current to flow in the first circuit path when the semiconductor switching element is conducting and to prevent current flow in the first circuit path when the semiconductor switching element is not conducting.

The second protective element and the second impedance element may be connected in series between the first and second output terminals.

The first impedance element and the second impedance element are substantially identical in the sense that the impedance elements are two separate physical elements having substantially identical physical properties, in particular electrical properties. Similarly, the first protective element and the second protective element are substantially identical in the sense that the protective elements are two separate physical elements having substantially identical physical properties, in particular electrical properties.

Accordingly, since the current flowing in the second circuit path is regulated to be substantially equal to the current flowing in the first circuit path, it is expected that the voltage between the first and second output terminals is substantially identical to the sum of the voltage drops across the first protective element and the first impedance element.

As a result, the voltage drop between the first terminal and the second terminal of the semiconductor switching element is substantially equal to the difference between the voltage provided by the voltage source and the voltage drop between the first output terminal and the second output terminal.

Thereby, the apparatus according to the first aspect provides a simple way of obtaining a precise measurement of the voltage between the first and second terminals of the semiconductor switching element.

According to an embodiment, the regulating circuit includes (a) a first measurement unit for measuring the current in the first circuit path, (b) a second measurement unit for measuring the current in the second circuit path, and (c) a regulator for regulating the current in the second circuit path in response to a difference between the currents measured by the first and second measurement units.

In other words, the regulating circuit constitutes a closed-loop regulator where the current in the second circuit path is regulated based on a measured difference relative to the current in the first circuit path.

According to a further embodiment, the regulating circuit further includes a subtracting unit for calculating the difference between the currents measured by the first and second measurement units.

The subtracting unit may be a digital subtracting unit capable of subtracting digitally represented measurement values, or the subtracting unit may be an analog circuit designed to subtract the current in the second circuit path from the current in the first circuit path in order to generate an error signal for the regulating circuit.

According to a further embodiment, the first measurement unit is adapted to measure the current in the first circuit path based on a voltage across the first impedance element, and the second measurement unit is adapted to measure the current in the second circuit path based on a voltage across the second impedance element.

In other words, the respective currents in the first and second circuit paths are measured by simple yet precise voltage measurement units connected to measure the voltages across the respective impedance elements.

According to a further embodiment, the first protective element and the second protective element are identical diodes.

The diodes are identical in the sense that the diodes are first of all diodes of the same type, preferably from the same production batch. Furthermore, it is assured that the electrical properties, such as current-voltage characteristic and temperature dependency, of the diodes are identical within a predetermined tolerance, providing substantially identical diodes.

According to a further embodiment, the first impedance element and the second impedance element are identical resistors.

The resistors are identical in the sense that the resistors are first of all resistors of the same type with the same nominal resistance, preferably from the same production batch. Furthermore, it is assured that the electrical properties, such as temperature dependency, of the resistors are identical within a predetermined tolerance, providing substantially identical resistors.

According to a further embodiment, the first protective element, the second protective element, the first impedance element, and the second impedance element are arranged to be exposed to substantially identical environmental influences.

In other words, the protective elements and impedance elements are arranged sufficiently close to one another that the elements will experience substantially the same temperature, humidity, pressure and other relevant physical parameters.

Accordingly, since the first and second protective elements and the first and second impedance elements are respectively substantially identical, exposed to substantially the same current and to substantially the same environmental influences, it is to be expected that the respective elements will operate in a highly similar, if not identical, manner.

Thus, the voltage measured at the first and second output terminals will provide a very precise value for the voltage across the semiconductor switching element.

According to a second aspect, there is provided a subsea device including (a) an adjustable speed drive including an insulated-gate bipolar transistor, and (b) an apparatus according to the first aspect or any of the above embodiments, wherein the first terminal is the collector of the inverted-gate bipolar transistor and wherein the second terminal is the emitter of the insulated-gate bipolar transistor.

This aspect is essentially based on the same idea as the first aspect described above and provides a subsea device with the capability of high precision measurement of the collector-emitter voltage of the IGBT, thereby allowing a useful analysis of the aging state of the IGBT.

According to an embodiment, the subsea device further includes (a) a current measurement unit for measuring the collector current of the insulated-gate bipolar transistor, and (b) a voltage measurement unit for measuring the collector-emitter voltage of the insulated-gate bipolar transistor based on the voltage drop between the first output terminal and the second output terminal of the apparatus.

As the collector-emitter voltage depends on the collector current, it can be determined whether the IGBT of the subsea device according to this embodiment has been influenced by aging by comparing corresponding values of collector-emitter voltages and collector currents.

Accordingly, it will be possible to obtain an estimate for the remaining lifetime of the subsea device in an easy and inexpensive manner.

According to a third aspect, there is provided a system for monitoring a subsea device according to the above embodiment of the second aspect. The system includes (a) a communication unit for communicating with the subsea device, (b) a memory unit, and (c) a processing unit, wherein the processing unit is adapted to receive corresponding measured values of collector current and collector-emitter voltage from the subsea device and to determine an aging state of the insulated-gate bipolar transistor based on a comparison of the received measured values and predetermined values of collector current and collector-emitter voltage stored in the memory unit.

The system according to this aspect is capable of processing corresponding values of collector current and collector-emitter voltage, in particular by comparing such values to predetermined values stored in the memory unit.

Thereby, the system may provide relevant information regarding aging to a system operator such that relevant measures may be taken before a subsea device malfunctions due to aging.

According to a fourth aspect, there is provided a method of precision measurement of a voltage drop between a first terminal and a second terminal of a semiconductor switching element. The method includes (a) providing a first circuit path including a first protective element, a first impedance element and a voltage source, wherein the first circuit path is adapted to be connected between the first terminal and the second terminal of the semiconductor switching element, (b) providing a second circuit path formed between a first output terminal and a second output terminal, the second circuit path comprising a second protective element and a second impedance element, wherein the second protective element is identical to the first protective element, and wherein the second impedance element is identical to the first impedance element, and (c) regulating the current in the second circuit path such that said current in the second circuit path is equal to the current in the first circuit path, wherein the voltage drop between the first terminal and the second terminal of the semiconductor switching element equals the difference between the voltage provided by the voltage source and the voltage drop between the first output terminal and the second output terminal.

The fourth aspect is essentially based on the same idea as the first aspect described above.

It is noted that embodiments have been described with reference to different subject matters. In particular, some embodiments have been described with reference to method type claims whereas other embodiments have been described with reference to apparatus type claims. However, a person skilled in the art will gather from the above and the following description that, unless otherwise indicated, any combination of features belonging to one type of subject matter may also belong any combination of features relating to different subject matters, in particular to combinations of features of the method type claims and features of the apparatus type claims.

The aspects defined above and further aspects of the present invention are apparent from the examples of embodiments to be described hereinafter and are explained with reference to the examples of embodiments. The invention will be described in more detail hereinafter with reference to examples of embodiments. However, it is explicitly noted that the invention is not limited to the described exemplary embodiments.

DESCRIPTION OF THE DRAWINGS

FIG. 3 shows a detailed circuit diagram of an example implementation of the apparatus shown in FIG. 2.

DETAILED DESCRIPTION

Figure 1:
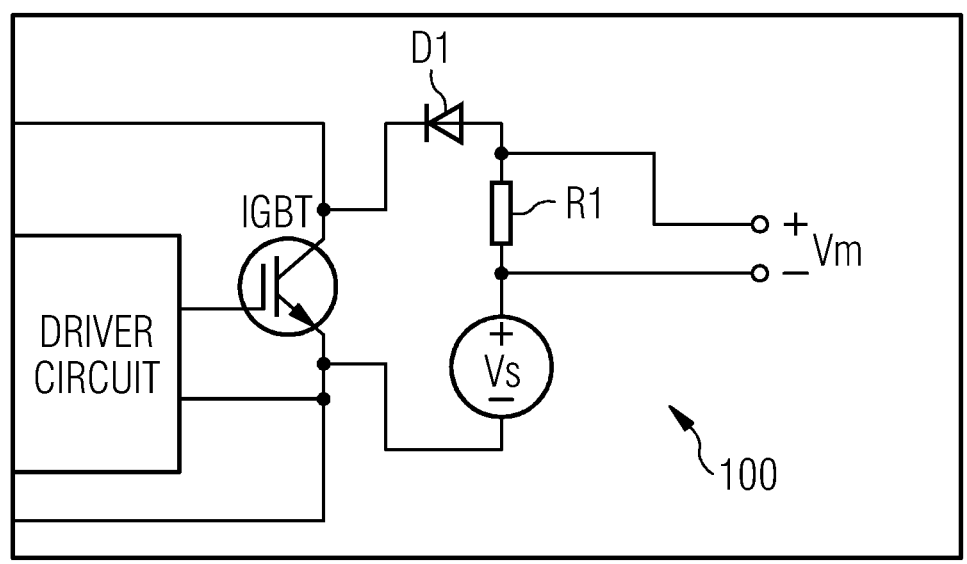
FIG. 1 shows a circuit for estimating a collector-emitter voltage drop of an IGBT according to the prior art.

The illustration in the drawing is schematic. It is noted that in different figures, similar or identical elements are provided with the same reference numerals or with reference numerals which differ only within the first digit.

FIG. 1 shows a circuit 100 for estimating a collector-emitter voltage drop of an IGBT according to the prior art. The circuit 100 has already been discussed in the introduction and will therefore not be discussed further here.

Figure 2:
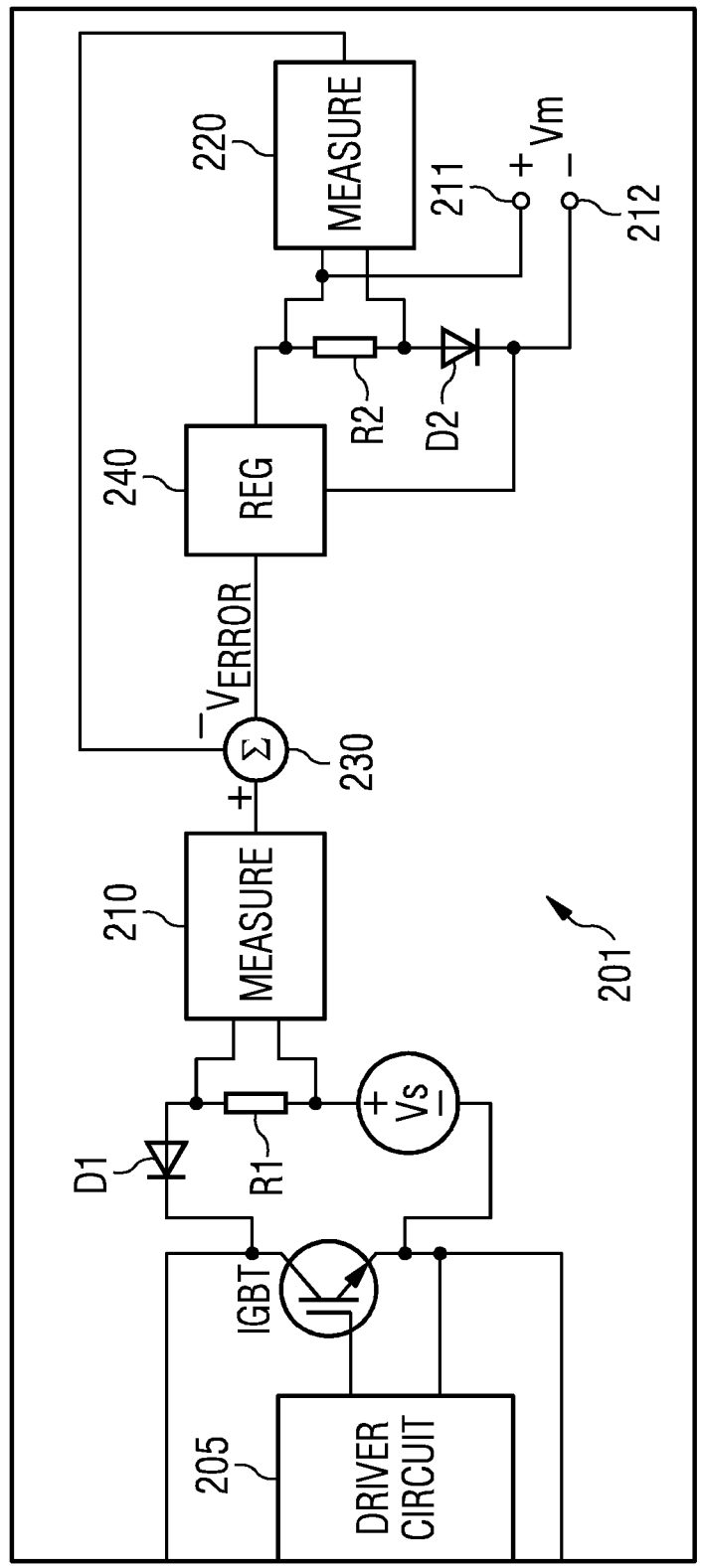
FIG. 2 shows a principal circuit diagram of an apparatus for precision measurement of a collector-emitter voltage drop of an IGBT in accordance with an embodiment.

FIG. 2 shows a principal circuit diagram of an apparatus 201 for precision measurement of a collector-emitter voltage drop of an IGBT in accordance with an embodiment. As shown, the gate terminal of the IGBT is connected to driver circuit 205 of a subsea adjustable speed drive device. The IGBT is coupled to act as a switch and is driven with a switching frequency between 200 Hz and 1200 Hz, where the nominal frequency is 600 Hz. When the IGBT is not conducting, the collector-emitter voltage is about 1 kV. It is noted that the principle of apparatus 201 works well for a voltage as low as 50 V. In practice, the voltage is not likely to exceed 2.5 kV, which is the limit of most semiconductors. When the IGBT is conducting, the collector-emitter voltage may be between 0.5V and 2.5V, depending on the collector current and the IGBT.

Like in the prior art circuit 100 shown in FIG. 1, a first diode D1, a first resistor R1 and a voltage source Vs are connected in series between the collector and emitter of the IGBT. The voltage level in source Vs is chosen so that the voltage level is higher than the voltage drop expected over the IGBT and the voltage drop over the resistor R1. Hence, the value of the resistor R1 and voltage source Vs must match. More specifically, the cathode of D1 is connected to the collector of the IGBT, the lower potential of Vs is connected to the emitter of the IGBT, and R1 is connected between the anode of D1 and the upper potential of Vs. The first diode D1, the first resistor R1 and the voltage source Vs constitute a first circuit path. It is noted that if desirable, for example for reasons of implementation considerations, the order of D1, R1 and Vs within the first circuit path may be changed. For example, Vs and R1 may be exchanged, such that Vs is arranged between R1 and D1.

The apparatus 201 further includes a second resistor R2 coupled in series with a second diode D2 between a first output terminal 211 and a second output terminal 212. The second resistor R2 and second diode D2 constitute a second circuit path. Similarly, as discussed above with regard to the first circuit path, the order of D2 and R2 may be exchanged, if desirable.

The second resistor R2 is identical to the first resistor R1 in the sense that R1 and R2 have the same resistance, are of the same type and, preferably but not necessarily, from the same production batch. Similarly, the second diode D2 is identical to the first diode D1 in the sense that D1 and D2 have the same current-voltage characteristic, are of the same type and, preferably but not necessarily, from the same production batch. Furthermore, R1 and R2 as well as D1 and D2 have the same temperature characteristics. The components are all arranged so close to each other that the components experience substantially identical environmental influence, in particular temperature, during operation. Accordingly, if the current flowing in the first circuit path D1, R1, Vs is the same as the current flowing in the second circuit path R2, D2, the total voltage drop across D1 and R1 will be identical to the total voltage drop across R2 and D2 (i.e., to the output voltage Vm between the first and second output terminals 211, 212).

A first measurement unit 210 is arranged to measure the voltage drop across the first resistor R1. Similarly, a second measurement unit 220 is arranged to measure the voltage drop across the second resistor R2. A subtracting unit 230 is coupled to the first and second measurement units 210, 220 to generate the difference or error voltage, Verror, between the voltage measured by the first measurement unit 210 and the second measurement unit 220. A voltage regulator 240 is provided to regulate the voltage Vm between the first and second output terminals 211, 212 in response to the error voltage Verror from the subtraction unit 230. More specifically, if the error voltage is positive, the voltage regulator increases the voltage between the output terminals 211, 212. Similarly, if the error voltage is negative, the voltage regulator reduces the voltage between the output terminals 211, 212.

In other words, the first measurement unit 210, second measurement unit 220, subtracting unit 230 and voltage regulator 240 constitute a closed-loop voltage regulating circuit that assures that the voltage across the second resistor R2 follows the voltage across the first resistor R1. As the resistors R1, R2 are identical, it follows that the currents through the resistors R1, R2 are also identical. Further, as also the diodes D1, D2 are identical (i.e. have the same current-voltage characteristic and temperature characteristic), the total voltage drop across D1 and R1 will be identical to the total voltage drop across R2 and D2 (i.e., to the output voltage Vm between the first and second output terminals 211, 212). Thus, the collector-emitter voltage Vce of the IGBT is given by Vce=Vs−Vm.

As the actual voltage across the first diode D1 is taken into account (instead of being estimated as in the prior art), the apparatus 201 is capable of providing a high precision measurement of the collector-emitter voltage Vce of the IGBT in the conducting state. Thereby, by also taking the collector current of the IGBT into account, the aging of the IGBT may be monitored by comparing the collector-emitter voltage Vce to corresponding predetermined values. These predetermined values may be stored in a memory of a monitoring system (not shown) or may be provided to a system operator as a table.

FIG. 3 shows a detailed circuit diagram 301 of an implementation of the apparatus shown in FIG. 2. The terminal labeled Vce is to be connected to the collector of an IGBT. In comparison to FIG. 2, it is noted that the second resistor is labeled R10 (instead of R2 as in FIG. 2) and that the first measurement unit 210, the second measurement unit 220, the subtracting unit 230 and the voltage regulator 240 are all implemented by standard analogue components, such as resistors, capacitors and operational amplifiers. The circuit 301 provides a fast and precise measurement output Vout. More specifically, the time to settle within 10 mV is approximately 27 µs. Accordingly, the circuit 301 is capable of providing a very precise measurement of a collector-emitter voltage of an IGBT when the latter is switched at frequencies as high as 20 kHz. In typical applications in subsea adjustable speed drives, where the switching frequency is between 200 Hz and 1200 Hz, the circuit 301 will provide excellent performance. For higher frequencies, faster operational amplifiers may be used, although the faster operational amplifiers may be less accurate.

It is noted that the term "comprising" does not exclude other elements or steps and the use of the articles "a" or "an" does not exclude a plurality. Also elements described in association with different embodiments may be combined. It is further noted that reference signs in the claims are not to be construed as limiting the scope of the claims.

Although the invention was illustrated and described in detail by the preferred exemplary embodiments, the invention is not restricted by the disclosed examples and other variations may be derived herefrom by the person skilled in the art without departing from the scope of protection of the invention.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. An apparatus for measurement of a voltage drop between a first terminal and a second terminal of a semiconductor switching element, the apparatus comprising
 a first circuit path comprising a first protective element, a first impedance element and a voltage source, wherein the first circuit path is configured to be connected between the first switch terminal and the second switch terminal of the semiconductor switching element,
 a second circuit path formed between a first output terminal and a second output terminal, the second circuit path comprising a second protective element and a second impedance element, wherein the second protective element is substantially identical to the first protective element, and wherein the second impedance element is substantially identical to the first impedance element, and
 a regulating circuit configured to regulate the current in the second circuit path such that said current in the second circuit path is equal to the current in the first circuit path,
 wherein a voltage drop between the first switch terminal and the second switch terminal of the semiconductor switching element equals a difference between the voltage provided by the voltage source and a voltage drop between the first output terminal and the second output terminal.

2. The apparatus according to claim 1, wherein the regulating circuit comprises:
a first measurement unit configured to measure the current in the first circuit path,
a second measurement unit configured to measure the current in the second circuit path, and
a regulator configured to regulate the current in the second circuit path in response to a difference between the currents measured by the first and second measurement units.

3. The apparatus according to claim 2, wherein the regulating circuit further comprises a subtracting unit configured to calculate the difference between the currents measured by the first and second measurement units.

4. The apparatus according to claim 2, wherein:
the first measurement unit is configured to measure the current in the first circuit path based on a voltage across the first impedance element, and
the second measurement unit is configured to measure the current in the second circuit path based on a voltage across the second impedance element.

5. The apparatus according to claim 1, wherein the first protective element and the second protective element are identical diodes.

6. The apparatus according to claim 1, wherein the first impedance element and the second impedance element are identical resistors.

7. The apparatus according to claim 1, wherein the first protective element, the second protective element, the first impedance element, and the second impedance element are arranged to be exposed to identical environmental influences.

8. The apparatus according to claim 3, wherein:
the first measurement unit is configured to measure the current in the first circuit path based on a voltage across the first impedance element, and
the second measurement unit is configured to measure the current in the second circuit path based on a voltage across the second impedance element.

9. The apparatus according to claim 8, wherein the first protective element and the second protective element are identical diodes.

10. The apparatus according to claim 9, wherein the first impedance element and the second impedance element are identical resistors.

11. A method of precision measurement of a voltage drop between a first terminal and a second terminal of a semiconductor switching element, the method comprising
providing a first circuit path comprising a first protective element, a first impedance element and a voltage source, wherein the first circuit path is adapted to be connected between the first terminal and the second terminal of the semiconductor switching element,
providing a second circuit path formed between a first output terminal and a second output terminal, the second circuit path comprising a second protective element and a second impedance element, wherein the second protective element is identical to the first protective element, and wherein the second impedance element is identical to the first impedance element, and
regulating, by a regulating circuit, the current in the second circuit path such that said current in the second circuit path is equal to the current in the first circuit path,
wherein a voltage drop between the first terminal and the second terminal of the semiconductor switching element equals a difference between the voltage provided by the voltage source and a voltage drop between the first output terminal and the second output terminal.

12. The apparatus according to claim 11, wherein providing the first and second circuit paths with the first protective element and the second protective elements comprises providing diodes.

13. The apparatus according to claim 11, wherein providing the first and second circuit paths with the first impedance element and the second impedance element comprises providing resistors.

14. The apparatus according to claim 1, further comprising an adjustable speed drive of a subsea device, the adjustable speed drive comprising an insulated-gate bipolar transistor.

15. The apparatus according to claim 14, further comprising:
a current measurement unit configured to measure the collector current of the insulated-gate bipolar transistor, and
a voltage measurement unit configured to measure the collector-emitter voltage of the insulated-gate bipolar transistor based on the voltage drop between the first output terminal and the second output terminal.

16. The apparatus according to claim 14 wherein the regulating circuit is configured to regulate the current in the second circuit path in response to a difference between measured currents.

17. The apparatus of claim 14, further comprising:
a communication unit for communicating with the subsea device,
a memory unit, and
a processor configured to receive corresponding measured values of collector current and collector-emitter voltage from the subsea device and to determine an aging state of the insulated-gate bipolar transistor based on a comparison of the received measured values and predetermined values of collector current and collector-emitter voltage stored in the memory unit.

* * * * *